United States Patent
Farr et al.

(10) Patent No.: US 7,435,763 B2
(45) Date of Patent: *Oct. 14, 2008

(54) SOLID FREEFORM COMPOSITIONS, METHODS OF APPLICATION THEREOF, AND SYSTEMS FOR USE THEREOF

(75) Inventors: Isaac Farr, Corvallis, OR (US); Terry M. Lambright, Corvallis, OR (US); Vladek P Kasperchik, Corvallis, OR (US); Christopher Oriakhi, Corvallis, OR (US); David A Neel, Albany, OR (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 413 days.

This patent is subject to a terminal disclaimer.

(21) Appl. No.: 10/817,038

(22) Filed: Apr. 2, 2004

(65) Prior Publication Data
US 2005/0218549 A1   Oct. 6, 2005

(51) Int. Cl.
G03C 5/00 (2006.01)
G03C 1/725 (2006.01)
B29C 35/04 (2006.01)

(52) U.S. Cl. .............. 522/83; 522/87; 522/88; 522/79; 522/182; 430/269; 430/281.1; 264/401

(58) Field of Classification Search ........... 522/79, 522/83, 87, 88, 182; 430/269, 281.1; 264/401
See application file for complete search history.

(56) References Cited

U.S. PATENT DOCUMENTS

| | | | |
|---|---|---|---|
| 4,598,037 A * | 7/1986 | Felten ................. | 430/281.1 |
| 6,399,282 B1 | 6/2002 | Kubota et al. | |
| 6,416,850 B1 * | 7/2002 | Bredt et al. .......... | 428/297.4 |
| 6,569,373 B2 * | 5/2003 | Napadensky ........ | 264/401 |
| 6,586,494 B2 * | 7/2003 | Mejiritski et al. ... | 522/107 |
| 6,742,456 B1 * | 6/2004 | Kasperchik et al. ... | 101/483 |
| 6,780,368 B2 * | 8/2004 | Liu et al. ............ | 264/401 |
| 6,863,859 B2 * | 3/2005 | Levy .................. | 264/401 |
| 2001/0033219 A1 | 10/2001 | Iha et al. | |
| 2004/0036200 A1 | 2/2004 | Patel et al. | |
| 2005/0003189 A1 * | 1/2005 | Bredt et al. .......... | 428/402 |

FOREIGN PATENT DOCUMENTS

DE          10158233 A1      11/2001
DE          101 58 233 A1 *   3/2003

* cited by examiner

Primary Examiner—Susan W Berman

(57) ABSTRACT

Compositions, methods of using the compositions, and solid freeform fabrication (SFF) systems for producing three-dimensional objects are disclosed. One exemplary composition, among others, includes a basic component, an acidic component, at least one monoacrylate component, a light sensitive initiator, and a polar binder. A polymerization reaction between the at least one monoacrylate component and the light sensitive initiator occurs upon exposure to optical energy. The polar binder includes a viscosity modifier and a surface tension modifier. The polar binder is capable of stimulating a crosslinking reaction between the basic component and the acidic component.

10 Claims, 1 Drawing Sheet

SOLID FREEFORM COMPOSITIONS, METHODS OF APPLICATION THEREOF, AND SYSTEMS FOR USE THEREOF

BACKGROUND

Solid freeform fabrication (SFF) or layer manufacturing (LM) is a fabrication technology that builds an object of any complex shape layer by layer or point by point without using a pre-shaped tool (die or mold). This process begins with creating a Computer Aided Design (CAD) file to represent the geometry of a desired object. SFF technology enables direct translation of the CAD image data into a three-dimensional object. SFF technology can be used in applications such as verifying CAD database, evaluating design feasibility, testing part functionality, assessing aesthetics, checking ergonomics of design, aiding in tool and fixture design, creating conceptual models and sales/marketing tools, generating patterns for investment casting, reducing or eliminating engineering changes in production, and providing small production runs.

One SFF technique involves adding or depositing a build composition to form predetermined areas of a layer essentially point-by-point. These predetermined areas together constitute a thin section of a three-dimensional object as defined by a CAD geometry. Successive layers are then deposited in a predetermined sequence with a layer being affixed to its adjacent layers forming an integral three dimensional, multi-layer object.

In a powder/binder SFF system an individual layer is printed by first spreading a thin layer of the powder and then dispensing the binder to adhere the powder together in selected regions to create the desired layer pattern. This process is repeated until all the layers have been printed. The binder joins powder together within a layer and between layers. After printing is complete, the unbound powder is removed, leaving a three-dimensional object with the desired geometry.

SUMMARY

Briefly described, embodiments of this disclosure includes compositions, methods of using the compositions, and solid freeform fabrication (SFF) systems for producing three-dimensional objects. One exemplary composition, among others, includes a basic component, an acidic component, at least one monoacrylate component, a light sensitive initiator, and a polar binder. A polymerization reaction between the at least one monoacrylate component and the light sensitive initiator occurs upon exposure to optical energy. The polar binder includes a viscosity modifier and a surface tension modifier. The polar binder is capable of stimulating a crosslinking reaction between the basic component and the acidic component.

One exemplary SFF system, among others, a dispensing system including a powder and a polar binder. The dispensing system is adapted to dispense the powder and the polar binder. The powder includes at least one component selected from a basic component and a first acidic component. The polar binder includes at least one component selected from a polar solvent, a second acidic component, a monoacrylate component, a surface tension modifier, a viscosity modifier, and a light sensitive initiator.

Methods of producing three-dimensional objects are also provided. One exemplary method includes, among others: includes providing a powder, wherein the powder includes at least one component selected from a basic component and a first acidic component; providing a polar binder, wherein the polar binder includes a surface tension modifier and a viscosity modifier, and wherein the polar binder includes at least one component selected from a polar solvent, a second acidic component, a monoacrylate component, and a light sensitive initiator; dispensing the powder and the polar binder onto a build platform to form a layer of a composition; and forming a three-dimensional object from the composition on the build platform.

BRIEF DESCRIPTION OF THE DRAWINGS

Many aspects of the invention can be better understood with reference to the following drawings. The components in the drawings are not necessarily to scale. Moreover, in the drawings, like reference numerals designate corresponding parts throughout the several views.

DETAILED DESCRIPTION

Solid freeform fabrication (SFF) compositions, methods of application thereof, and systems for using the SFF compositions are provided. In particular, the embodiments relate to the use of SFF compositions in the manufacture of three-dimensional objects by SFF systems and methods. The term three-dimensional object refers to objects that are sufficiently rigid to maintain a fixed volume and shape to an extent, which is appropriate for the specific use.

Embodiments of the SFF composition can include components such as, but not limited to, a basic component, an acidic component, at least one monoacrylate component (monomeric acrylate component), a light sensitive initiator, and combinations thereof. Embodiments disclosed herein include a plurality of combinations of components and exemplar combinations are described below. In addition, the SFF composition can include additional components such as, but not limited to, retardants, wetting agents, viscosity modifiers, surface tension modifiers, fibers, colorants, dispersants, antioxidants, solvents, and combinations thereof.

The components of the SFF composition can be included in a SFF powder and/or a polar binder. The ratio of polar binder to SFF powder can be from about 0.05:1 to 0.6:1, and from about 0.1:1 to 0.4:1. The ratio of polar binder to SFF powder depends upon many variables such as, but not limited to, the components, the concentration of each component, and the percentage of each component in the SFF powder; the components, the concentration of each component, and the percentage of each component in the polar binder; and combinations thereof.

Various combinations of components in the SFF powder and/or the polar binder are feasible and the following illustrate exemplar embodiments. For example, in one embodiment the SFF powder includes, but is not limited to, the basic component, the basic component and the acidic component, while the polar binder includes, but is not limited to, the polar solvent, the monoacrylate component, and the light sensitive initiator.

In another embodiment, the SFF powder includes, but is not limited to, the basic component, while the polar binder includes, but is not limited to, the polar solvent, the acidic component, the monoacrylate component, and the light sensitive initiator.

In still another embodiment, the SFF powder includes, but is not limited to, the basic component and an acidic component, while the polar binder includes, but is not limited to, the polar solvent, another acidic component, the monoacrylate component, and the light sensitive initiator.

Figure 1:
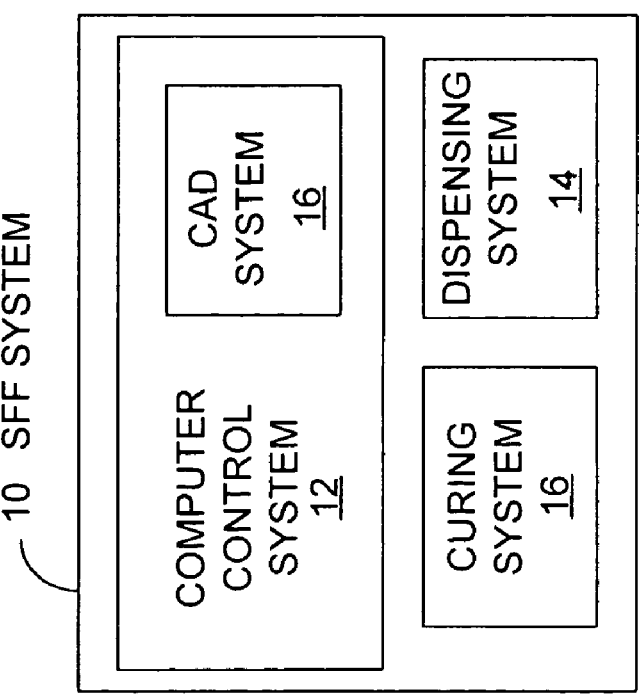
FIG. 1 illustrates an embodiment of a solid freeform fabrication (SFF) system.

FIG. 1 illustrates a block diagram of a representative SFF system 10 that includes, but is not limited to, a computer control system 12, a dispensing system 14, and a conventional curing system 16. In addition, the SFF system 10 can optionally include a positioning system, and a build platform temperature control system. The computer control system 12 includes a process control system that is adapted to control the dispensing system 14, the curing system 16 (e.g., a thermal, an ultraviolet, and/or a visible radiation curing system), the positioning system, and the build platform temperature control system. Furthermore, the computer control system 12 includes, but is not limited to, a Computer Aided Design (CAD) system 16 or other SSF CAD-related systems.

The dispensing system 14 includes, but is not limited to, conventional powder spreading technologies, conventional ink-jet technologies, conventional fluid coating technologies, and combinations thereof. The components of the SFF composition can be dispensed using one or more of these technologies in an iterative and/or simultaneous fashion. In addition, the components of the SFF composition can be dispensed independently of one another or in one or more combinations.

In one embodiment, the SFF powder is dispensed using conventional powder spreading techniques. The powder spreading system includes a powder supply bin and a method for spreading the powder into a build bin where the object is being built. Examples of powder spreading systems are described in U.S. Pat. Nos. 5,340,656, 5,204,055, and 5,387,380, which are incorporated herein by reference.

Ink-jet technology, such as drop-on-demand and continuous flow ink-jet technologies, can be used to dispense components of the SFF composition onto a build platform. The dispensing system 14 can include at least one conventional ink-jet printhead (e.g., thermal ink-jet printhead and/or a piezo ink-jet print head) adapted to dispense (e.g., jet) one or more components through one or more of a plurality of ink-jet printhead dispensers. In addition, the ink-jet printhead can include a plurality of ink-jet compartments (e.g., tanks or wells for containing the components) that are capable of holding the components and are fluidically coupled to the ink-jet printhead dispensers. The ink-jet printhead dispenser can be heated to assist in dispensing viscous components. For example, the in piezo-electric technologies the ink-jet printhead dispenser can be heated up to about 200° C., and preferably in the range of 70 to 120° C., while lower temperatures are used for thermal inkjet technologies such as about 50-90° C.

In one embodiment, the dispensing system 14 includes a separate ink-jet printhead for components (e.g., polar binder, colorants, and solvents) of the SFF composition. For example, in a SFF system 10 having two ink-jet printheads, one ink-jet printhead holds the polar binder and one ink-jet printhead holds the colorant.

The SFF system 10 can be incorporated into processes that are used to fabricate or construct three-dimensional objects in an iterative-layered process. The computer control system 12 is capable of being selectively adjusted to control the output from the dispenser system 14, which controls the thickness and pattern of each component in each layer of the iterative process.

For example, the SFF powder and the polar binder can be dispensed onto the build platform in a variety of patterns. The patterns can take the form of, but not limited to, alternating layers of the SFF powder and the polar binder. In addition, the patterns of the SFF powder and the polar binder can vary depending on the thickness of the SFF powder, the particle size of the SFF powder, and the volume (e.g., drops) of the polar binder. In this regard, multiple passes (e.g., scans) across the build platform 20 can be conducted to achieve the appropriate coverage of the SFF powder and the polar binder.

In general, the lower limit for the thickness of SFF powder spread during each pass is limited by the size of the particles of the SFF powder. The SFF powder particle size can be about 0.005 millimeters (mm) to 1 mm, about 1 to 100, and about 10 to 70. The layer thickness can be from about 10 to 1000 microns and from about 25 to 100 microns. However, the desirable amount of SFF powder spread depends upon on a number of factors such as, but not limited to, the time required to build the object, the surface roughness, and the feature tolerance of the printed object. In general, the volume of the components dispensed using inkjet technologies are from about 0.1 picoliters to 500 picoliters, about 0.1 picoliters to 100 picoliters, and about 0.1 picoliters to 35 picoliters. However, the desirable ejected volume of these components depends on a number of factors such as, but not limited to, the concentration and the chemical characteristics of the components; the temperature of the components, the desired resolution (e.g., 600 drops per inch), and the design of the printhead firing chamber.

Figure 2:
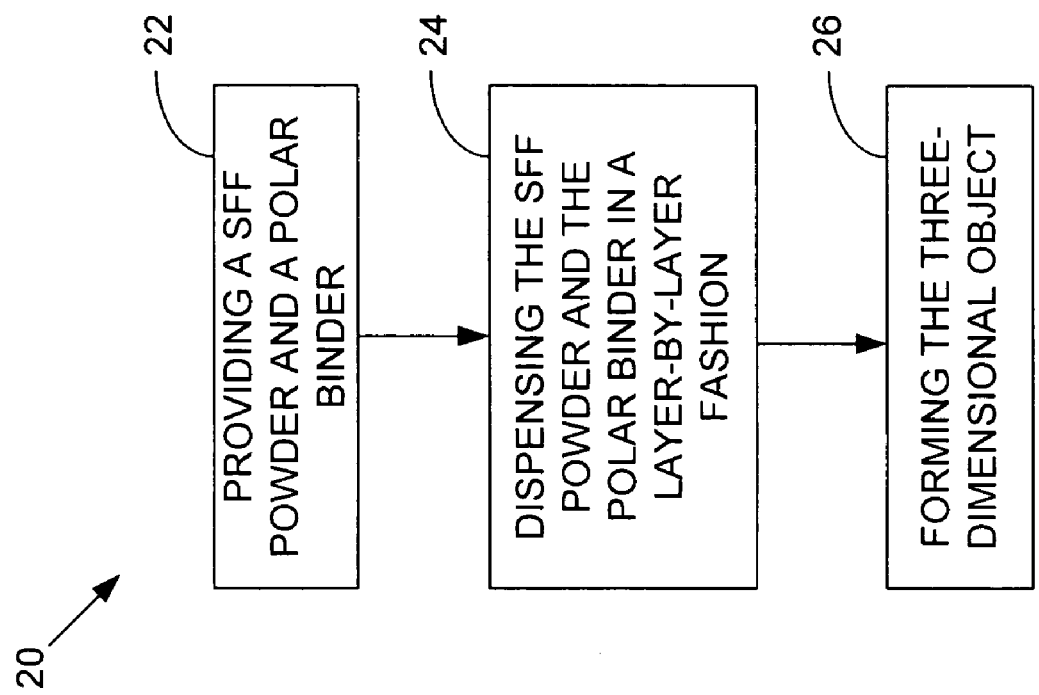
FIG. 2 illustrates a flow diagram of a representative embodiment for forming a three-dimensional object using the SFF system described in FIG. 1

FIG. 2 is a flow diagram describing a representative method 30 for forming an object using the SFF system 10. The SFF powder and the polar binder are provided, as shown in block 22. The SFF powder and the polar binder are dispensed onto the build platform in a layer-by-layer fashion, as shown in block 24. For example, the SFF powder is first spread onto the build platform using a roller. Then the polar binder is dispensed onto portions of the SFF powder as controlled by the computer system 12. The SFF powder and the polar binder are commingled and form a layer of the SFF composition. After a plurality of layers of the SFF powder and the polar binder are dispensed onto the build platform, the three-dimensional object is formed, as shown in block 26.

The SFF powder and the polar binder should be able to react to form a "tack free" layer within about 5 seconds to 10 minutes at a temperature below about 100° C. Preferably, the SFF powder and the polar binder should be able to react to form a "tack free" layer within about 5 seconds to 1 minute at a temperature below about 60° C. The term "tack free" is defined as the point where the crosslinking/chain growth reaction has progressed such that the resulting material is no longer tacky to the touch. It does not imply that chain growth is complete.

Although not intending to be bound by theory, one or more chemical interactions can be used to describe the chemistry of the SFF composition. The chemical interactions include, but are not limited to, a acid/base hardening mechanism and a light activated polymerization mechanism, and combinations thereof, each of which are briefly described below.

In the acid/base hardening mechanism, the acid component is soluble in the polar binder (e.g., the acid compound is acidic relative to water). Thus, contact of the acidic component with the polar binder causes protons to dissociate from the acidic component. The free protons are attracted to the basic component and the basic component releases multivalent cations as the protons replace the cations.

The released cations from the basic component mediate the crosslinking of the compounds that make up the acid component. Ionic crosslinking of the acidic compounds reduces the mobility of the acid component. Eventually the crosslinking process results in solidification of the acid component in the solution, followed by setting and further hardening of the SFF material. The acid/base hardening mechanism facilitates curing by ionic reactions like neutralization, salt formation, chelation, and/or crystallization.

The light activated polymerization mechanism includes the interaction of the light sensitive initiator with light (e.g., ultraviolet and/or visible light) from a light source (e.g., the curing system 16). Interaction of the light with the light sensitive initiator causes the light sensitive initiator to form a radical initiator. The radical initiator initiates the polymerization of the one or more acrylates to produce polymeric forms of the given monomers.

It should be noted that any combination of the acid/base hardening mechanism and the light activated polymerization mechanism can be used to form each layer of the three-dimensional object.

The acid/base hardening mechanism, the chemically activated polymerization mechanism, and/or the light activated polymerization mechanism provides a non-porous three-dimensional object having superior compressive strength and significantly better mechanical properties relative to common systems typically used in SFF systems. In addition, the need for post-processing the three-dimensional object is decreased and eliminated in some instances. Further, the acid/base hardening mechanism and polymerizations mechanisms are fast, which minimizes diffusion of the polar binder into the surrounding SFF powder and thus providing a continuous texture and finish. Furthermore, the light activated polymerization mechanism is controllable by exposure time and applied energy. Now having described embodiments of this disclosure, exemplary chemicals for the acid component, the basic component, the monoacrylate component, the polar binder, and the light sensitive initiator, are described below.

In general, the acid component can include compounds having molecular weights from about 20,000-1,000,000 g/mol. In particular, the acid component can include, but is not limited to, alginic acid, gum arabic, nucleic acids, pectins, proteins (biopolymers), carboxymethylcellulose, ligninsulphonic acids, acid-modified starch (chemically modified biopolymers), polymethacrylic acid, polyvinyl sulphonic acid, polystyrene sulphonic acid, polysulphuric acid, polyvinyl phosphonic acid, polyvinyl phosphoric acid, the homo- and copolymers of unsaturated aliphatic carbonic acids such as acrylic acid, itaconic acid, mesaconic acid, citraconic acid, aconitic acid, maleic acid, fumaric acid, glutaconic acid, tiglic acid and methacrylic acid and the anhydrides of these carbonic acids (e.g. itaconic acid anhydride). These polycarbonic acid anhydrides form precursors of the polycarbonic acids, which are transferred by water contact into polycarbonic acid. Further suitable polyacid components include, but are not limited to, the copolymers of the polyacids with acrylic amide, acrylic nitrile, acrylic acid esters, vinyl chloride, allyl chloride, vinyl acetate and 2-hydroxyethyl methacrylate (synthetic polyelectrolytes).

In one embodiment, the acid component could be partially or fully substituted with unsaturated polymerizable acidic moieties of a monomeric or oligomeric nature, as well as their salts or other acid derivative groups. Polymerizable unsaturated monomers, oligomers or prepolymers with acid groups or reactive acid-derivative groups include, but is not limited to:

a. unsaturated organic esters of phosphoric and phosphonic acids (German AS No. 2 711 234 & German OS No. 3 150 285, both are incorporated herein by reference), b. unsaturated organic esters of monofluorophosphoric acid (U.S. Pat. No. 3,997,504, incorporated herein by reference), c. unsaturated organic esters of phosphoric acids that contain either chlorine or bromine bonded directly to the phosphorus (Eur. Pat. No. 0 058 483, incorporated herein by reference), d. unsaturated organic esters of phosphoric acid in the form of pyrophosphates (anhydrides) (German OS No. 3 048 410, incorporated herein by reference), e. unsaturated carboxylic acids, f. unsaturated sulfur-containing organic acid moieties with groups of —$SO_2H$, —$SO_3H$, —O—$SO_3H$ type, g. unsaturated organic derivatives of boric acid i.e. the ones containing groups: —$B(OH)_2$, $B(OH)(OR)$, —O—$B(OH)_2$, —O—$B(OH)(OR)$ wherein R is H or alkyl, h. unsaturated organic moieties containing cationic acid radicals like $NR_2H^+$, -$RR_2H^+$ (wherein R is H or alkyl), and/or i. unsaturated organic moieties containing different combinations of the acidic species listed in the a)-h).

The reactive acid derivatives can be substituted with acid halides, with acid anhydrides, and with acid amides, nitriles, and esters, that readily hydrolyze into acid, as such can enter into ion-exchange, neutralization, salt formation, or chelation reactions with the base component (e.g., metal oxides, ceramics, zeolites or leachable reactive glasses). Preferred are acid groups or reactive acid derivatives include carboxylate, phosphate, phosphonate, sulfonate, or borate acid radicals or of their reactive derivatives.

The polymerizable unsaturated monomers, oligomers, or prepolymers of the acid component can include, but is not limited to, one or more of the following groups: alkenyl groups, alkenoxy groups, cycloalkenyl groups, aralkenyl groups, or alkenaryl radicals groups, with acryl, methacryl, vinyl, or styryl radicals being preferable. Preferred compounds are those that contain at least two polymerizable groups or at least two acid groups or acid-derivative groups. Examples are phosphoric-acid esters of glycerine dimethacrylate or 1-methacryloxyethane-1,1-diphosphonic acid. The SFF composition can include the acid component from 1% to about 40% and from about 5% to about 30% by weight of the SFF composition.

The basic component can include, but is not limited to, a metal oxide (e.g., Ca, Al, Fe, and Ba) and salts thereof and reactive glasses (e.g., silanized reactive aluminosilicate, calcium aluminosilicate and calcium aluminum glass). The SFF composition can include the basic component from 20% to about 80% and from about 30% to about 70% by weight of the SFF composition.

Examples of acid-base combinations include, but are not limited to, the following.

a. Zinc oxide—polycarboxylic acid cements.

b. Metal oxide (e.g., Be, Zn, Cu, Mg, Ca, Sr, and Ba)—orthophosphoric or poly(phosphoric acid) cements. In this embodiment, metal cations crosslink phosphate anions resulting in the formation of a hydrogel matrix.

c. A mixture of reactive aluminosilicate glasses with orthophosphoric or poly(phosphoric acid). In this embodiment, setting of the cement involves the formation of a hydrogel matrix of silica gel and ionically crosslinked phosphate ions. The average particle size for the glass is preferably approximately 30 µm or less, as glass particles with a smaller diameter can be difficult to spread.

d. Oxysalt-bonded cements. These are formed by acid-base reactions of metal oxide powder such as ZnO or MgO, and a concentrated solution of metal chloride or sulfate where the metal is, for example, Zn or Mg.

e. Glass-ionomer cements. In this embodiment, the basic component of the system is reactive aluminosilicate glass and the acidic component of the system is organic polyacid containing functional groups such as —COOH, —$SO_3H$, and —$PO_3H_2$. The glass ionomer mixture may also contain small amounts of low molecular weight complexing agent such as L- or D-tartaric acid for adjusting the kinetics of the cement setting process. In some embodiments, the glass-ionomer cements should be pretreated to make the surface of the polyacid powder less hydrophilic and therefore less susceptible to clumping due to moisture absorption. A preferable pretreatment includes the addition of some anti-caking hydrophobic agent to the dry cement mix. The agent could include some stearate salts (e.g., Mg, Ca, Zn) or lecithin.

The monomeric acrylate component can include monoacrylates such as, but is not limited to, water-soluble mono-, di-, tri-, and tetra-functional acrylate monomers. In particular, the monomeric acrylate component can include, but is not limited to, 2-hydroxyethyl methacrylate, hydroxypropyl methacrylate, ethylene glycol methacrylate and dimethacrylates, glycerine monomethacrylate, methyl methacrylate, 2-tert-butylaminomethyl methacrylate, tetrahydrofurfuryl methacrylate, ethyltriglycol monomethacrylate, dimethylaminoethyl methyacrylate, methacrylic acid, glycerine dimethacrylate, triethylene glycol dimethacrylate, urethane methacrylate, and bis-EMA (e.g., ethoxylated bisphenol-A-dimethacrylate).

In addition, the monomeric acrylate component can also include, but is not limited to, metal salts of methacrylate and acrylate. In particular, the monomeric acrylate component can include, but is not limited to, sodium methacrylate, potassium methacrylate, ammonium methacrylate, magnesium methacrylate, calcium methacrylate, aluminum methacrylate, zinc methacrylate, zirconium methacrylate, zirconium trihydroxymonomethacrylate, zirconium dihydroxydimethacrylate, sodium acrylate, potassium acrylate, ammonium acrylate, magnesium acrylate, calcium acrylate, aluminum acrylate, zinc acrylate, zirconium acrylate, zirconium trihydroxymonoacrylate, and zirconium dihydroxyacrylate.

The monomeric acrylate component can also include, but is not limited to, other acrylates having ethylenically unsaturated groups and acid groups (e.g., —COOH) or ethylenically unsaturated groups, acid groups (e.g., —COOH) and base groups (e.g., —$NH_2$) in one component. The monomeric acrylates having ethylenically unsaturated groups also include the acid esters that can be formed from the above-stated mono- and dimethacrylates. The SFF composition can include the acrylate component from 5% to about 50% and from about 20% to about 50% by weight of the SFF composition.

The light sensitive initiator can include, but is not limited to, UV initiators and/or visible initiators. The UV initiator can include chemicals such as, but not limited to, a free radical initiator, a cationic initiator, or combinations thereof. The free-radical initiator includes compounds that produce a free radical on exposure to UV radiation. The free-radical is capable of initiating a polymerization reaction. Exemplar free-radical initiators include, but are not limited to, benzophenones (e.g., benzophenone, methyl benzophenone, Michler's ketone, and xanthones), acylphosphine oxide type free radical initiators (e.g., 2,4,6-trimethylbenzoyldiphenyl phosphine oxide (TMPO), 2,4,6-trimethylbenzoylethoxyphenyl phosphine oxide (TEPO), and bisacylphosphine oxides (BAPO's)), azo compounds (e.g., AIBN), benzoins, and benzoin alkyl ethers (e.g., benzoin, benzoin methyl ether and benzoin isopropyl ether).

The free-radical initiator can be used alone or in combination with a co-initiator. Co-initiators are used with initiators that need a second molecule to produce a radical that is active in UV-systems. For example, benzophenone uses a second molecule, such as an amine, to produce a reactive radical. A preferred class of co-initiators are alkanolamines such as, but not limited to, triethylamine, methyldiethanolamine and triethanolamine Suitable cationic initiators include, but are not limited to, compounds that form aprotic acids or Bronsted acids upon exposure to UV light sufficient to initiate polymerization. The cationic initiator used may be a single compound, a mixture of two or more active compounds, or a combination of two or more different compounds (e.g., co-initiators). Exemplary cationic initiators include, but are not limited to, aryldiazonium salts, diaryliodonium salts, triarylsulphonium salts, and triarylselenium salts.

The visible radiation initiator can include, but is not limited to, diketones (e.g., camphorquinone, 1,2-acenaphthylenedione, 1H-indole-2,3-dione, 5H-dibenzo[a,d]cycloheptene-10, and 11-dione), phenoxazine dyes (e.g., Resazurin, Resorufin), acylphosphine oxides, (e.g., diphenyl (2,4,6-trimethylbenzoyl) phosphine oxide), and the like. The SFF composition can include the light sensitive initiator from 0.01% to about 5% and from about 0.01% to about 3% by weight of the SFF composition.

The polar binder functions, at least, as a solvent. In addition, the polar binder functions to stimulate a crosslinking reaction between the basic component and the acidic component. The polar binder can include, but is not limited to, water, ethanol, hexanediol, pentanediol, water-soluble acryates and combinations thereof.

As mentioned above, the SFF powder and/or the polar binder can include additional components such as, but not limited to, retardants, inhibitors, wetting agents, viscosity modifiers, surface tension modifiers, colorants (e.g., dyes, pigments, inks), dispersants, antioxidants, water retaining additives, accelerators, humectants, solvents, and combinations thereof.

Additional components can be used in the SFF powder and/or the polar binder to obtain the proper balance of cure rate, layer-to-layer adhesion, toughness, and glass transition temperature, of the three-dimensional object. Furthermore, the components can be used to alter the physical and/or chemical properties (e.g., viscosity, reactivity, surface tension, bubble formation, and wetting of the ejection chamber) of the SFF powder and/or the polar binder prior to and/or after being dispensed.

The retardant functions to, at least, slow down the setting reaction of the polyacid and the crosslinking multivalent cations The retardant can include, but is not limited to, sodium phosphate, potassium phosphate, potassium oxalate, sodium oxalate, sodium carbonate, potassium carbonate, salicylic acid, tartaric acid, dihydroxytartaric acid, oxalic acid, citric acid, ethylenediamine tetraacetic acid (EDTA) and their sodium and potassium salts, sodium phosphate, sodium dihydrogen phosphate as well as sodium hydrogen phosphate, magnesium oxide and tin fluoride and combinations thereof. The SFF composition can include the retardant from 1% to about 10% and from about 2% to about 8% by weight of the SFF composition.

The inhibitor functions to, at least, quench premature curing reactions. The inhibitor can inlcude, but is not limited to, t-butylhydroxy toluene, methyl ethyl ketone, and combinations thereof. The SFF composition can include the inhibitor from 0.01% to about 1% and from about 0.01% to about 0.1% by weight of the SFF composition.

The accelerator functions to, at least, crosslink with the acid component and/or the acrylate component and enhances the physical property of the three-dimensional object. The accelerator can form compounds such as, but not limited to, $Al^{3+}$ compounds (e.g., $Al(NO_3)_3$, $Al_2(PO_4)_3$, and $Al_2(SO_4)_3$) and $Zn^{2+}$ compounds (e.g., $ZnO$, $Zn(NO_3)_2$, and $Zn(SO_4)$). The SFF composition can include the accelerator from 0.1% to about 10% and from about 1% to about 5% by weight of the SFF composition.

The wetting agent functions to, at least, wet the resistor. The wetting agent can include, but is not limited to, tergitols, ethylene glycols, and fluorosurfactants, and combinations thereof. The SFF composition can include the wetting agent from 0.01% to about 3% and from about 0.1% to about 1% by weight of the SFF composition.

The viscosity modifier functions to, at least, increase or decrease the viscosity of the binder composition. The viscosity modifier can include, but is not limited to, ethanol, hexanediol, pentanediol, ethylene glycol diacetate, potassium aluminium sulphate, isopropanol, ethylene glycol monobutyl ether, diethylene monobutyl ether, dodecyldimethylammonium proposane sulphonate, glycerine triacetate, ethyl acetoacetate, polyvinyl pyrrolidone, polyethylene glycol, polyacrylic acid, sodium polyacrylate, and combinations thereof. The SFF composition can include the viscosity modifier from 1% to about 30% and from about 5% to about 20% by weight of the SFF composition.

The surface tension modifier functions to, at least, increase or decrease the surface tension of the binder composition. In addition, the surface tension modifier functions to clear the inkjet orifice plate of extraneous liquid that might interfere with drop ejection. The surface tension modifier can include, but is not limited to, ethanol, hexanediol, pentanediol, tergitols, ethylene glycols, fluorosurfactants, and combinations thereof. The SFF composition can include the surface tension modifier from 0.01% to about 30% and from about 0.1% to about 20% by weight of the SFF composition.

The addition of fibers to the SFF powder may be performed to vary and/or improve the mechanical properties (e.g., bending strength and fracture toughness) of the three-dimensional object. The fibers can include, but are not limited to, polymer fibers, ceramic fibers, natural fibers, carbon fibers, glass fibers, and combinations thereof. More specifically, the fibers can include, but are not limited to, cellulose fibers, wood fibers, polypropylene fibers, aramide fibers, silicon carbide fibers, aluminium silicate fibers, and derivative of each of these exemplary fibers. The powder can include fibers from 1% to about 30% and from about 3% to about 20% by weight of the SFF composition.

It should be noted that ratios, concentrations, amounts, and other numerical data may be expressed herein in a range format. It is to be understood that such a range format is used for convenience and brevity, and thus, should be interpreted in a flexible manner to include not only the numerical values explicitly recited as the limits of the range, but also to include all the individual numerical values or sub-ranges encompassed within that range as if each numerical value and sub-range is explicitly recited. To illustrate, a concentration range of "about 0.1% to about 5%" should be interpreted to include not only the explicitly recited concentration of about 0.1 wt % to about 5 wt %, but also include individual concentrations (e.g., 1%, 2%, 3%, and 4%) and the sub-ranges (e.g., 0.5%, 1.1%, 2.2%, 3.3%, and 4.4%) within the indicated range.

Many variations and modifications may be made to the above-described embodiments. All such modifications and variations are intended to be included herein within the scope of this disclosure and protected by the following claims.

The invention claimed is:

1. A composition, comprising:
   a basic component selected from the group consisting of beryllium oxide, zinc oxide, copper oxide, magnesium oxide, calcium oxide, strontium oxide, barium oxide, and salts thereof: reactive glasses; and combinations thereof;
   an acidic component;
   at least one monoacrylate component, wherein the acidic component and the monoacrylate component are different compounds;
   a light sensitive initiator;
   a polar binder;
   a viscosity modifier; and
   a surface tension modifier;
   wherein the basic component is in the form of a powder and is cation releasing in the presence of the acidic component, the released cations from the basic component mediating crosslinking and solidification of the acidic component;
   wherein the polar binder includes the viscosity modifier and the surface tension modifier;
   wherein the light sensitive initiator initiates a polymerization reaction between monomers of the at least one monoacrylate component by free radicals formed when the light sensitive initiator is exposed to optical energy while being present with the monoacrylate component;
   and wherein the polar binder is capable of stimulating a crosslinking reaction between the basic component and the acidic component.

2. The composition of claim 1, wherein the light sensitive initiator is selected from ultraviolet initiators, visible initiators, and combinations thereof.

3. The composition of claim 1, further comprising components selected from a retardant, an inhibitor, a wetting agent, a colorant, and combinations thereof.

4. The composition of claim 1, wherein the acidic component is in the form of a powder; and wherein the polar binder further includes a polar solvent, the at least one monoacrylate component, and the light sensitive initiator.

5. The composition of claim 4, wherein the powder components have a particle size from about 1 to 100 microns.

6. The composition of claim 1, wherein the polar binder further includes a polar solvent, the acidic component, the at least one monoacrylate component, and the light sensitive initiator.

7. The composition of claim 1, wherein the acidic component is in the form of a powder; wherein the polar binder further includes a polar solvent, a second acidic component, the at least one monoacrylate component, and the light sensitive initiator.

8. The composition of claim 1, wherein the viscosity modifier is selected from ethanol, hexanediol, pentanediol, ethylene glycol diacetate, potassium aluminium sulphate, isopropanol, ethylene glycol monobutyl ether, diethylene monobutyl ether, dodecyldimethylammonium proposane sulphonate, glycerine triacetate, ethyl acetoacetate, polyvinyl pyrrolidone, polyethylene glycol, polyacrylic acid, sodium polyacrylate, and combinations thereof.

9. The composition of claim 1, wherein the surface tension modifier is selected from ethanol, hexanediol, pentanediol, tergitols, ethylene glycols, fluorosurfactants, and combinations thereof.

10. The composition of claim 1, wherein the acidic component is selected from alginic acid, gum arabic, nucleic acids, pectins, proteins, carboxymethylcellulose, ligninsulphonic acids, acid-modified starch, polyacrylic acid, polymethacrylic acid, polymethacrylic acid copolymer with methyl methacrylate, polyvinyl sulphonic acid, polystyrene sulphonic acid, polysulphuric acid, polyvinyl phosphonic acid, polyvinyl phosphoric acid, the homo- and copolymers of unsaturated aliphatic carbonic acids, the anhydrides of the unsaturated aliphatic carbonic acids, and combinations thereof.

* * * * *

UNITED STATES PATENT AND TRADEMARK OFFICE
CERTIFICATE OF CORRECTION

PATENT NO. : 7,435,763 B2  Page 1 of 1
APPLICATION NO. : 10/817038
DATED : October 14, 2008
INVENTOR(S) : Isaac Farr et al.

It is certified that error appears in the above-identified patent and that said Letters Patent is hereby corrected as shown below:

In column 10, line 10, in Claim 1, delete "thereof:" and insert -- thereof; --, therefor.

Signed and Sealed this

Fifth Day of May, 2009

JOHN DOLL
*Acting Director of the United States Patent and Trademark Office*